United States Patent
Debacker et al.

(10) Patent No.: US 10,510,774 B2
(45) Date of Patent: Dec. 17, 2019

(54) INTEGRATED CIRCUIT POWER DISTRIBUTION NETWORK

(71) Applicant: IMEC VZW, Leuven (BE)

(72) Inventors: Peter Debacker, Heverlee (BE); Praveen Raghavan, Leefdaal (BE); Vassilios Constantinos Gerousis, San Jose, CA (US)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 15/479,633

(22) Filed: Apr. 5, 2017

(65) Prior Publication Data

US 2017/0294448 A1 Oct. 12, 2017

(30) Foreign Application Priority Data

Apr. 6, 2016 (EP) .................................. 16164134

(51) Int. Cl.
*H01L 27/118* (2006.01)
*H01L 23/528* (2006.01)
*H01L 27/02* (2006.01)

(52) U.S. Cl.
CPC .... *H01L 27/11807* (2013.01); *H01L 23/5286* (2013.01); *H01L 27/0207* (2013.01); *H01L 2027/11875* (2013.01); *H01L 2027/11881* (2013.01); *H01L 2027/11888* (2013.01)

(58) Field of Classification Search
CPC ..... H01L 27/11807; H01L 2027/11881; H01L 2027/11888
See application file for complete search history.

(56) References Cited

U.S. PATENT DOCUMENTS

| | | | |
|---|---|---|---|
| 5,742,099 A * | 4/1998 | Debnath | H01L 23/5286 257/207 |
| 2008/0048331 A1* | 2/2008 | Chen | H01L 23/50 257/773 |
| 2010/0097875 A1 | 4/2010 | Vinke et al. | |

(Continued)

OTHER PUBLICATIONS

Extended European Search Report dated Oct. 17, 2016 for European Application No. EP 16164134.5, filed Apr. 6, 2016, which corresponds in priority to above-identified subject U.S. application.

*Primary Examiner* — Zandra V Smith
*Assistant Examiner* — Andre C Stevenson
(74) *Attorney, Agent, or Firm* — Knobbe Martens Olson & Bear, LLP

(57) ABSTRACT

An integrated circuit (IC) power distribution network is disclosed. In one aspect, the IC includes a stack of layers formed on a substrate. The IC includes standard cells with parallel gate structures oriented in a direction y. Each cell includes an internal power pin for supplying a reference voltage to the cell. The stack includes metal layers in which lines are formed to route signals between cells. The lines in each metal layer have a preferred orientation that is orthogonal to that of the lines in an adjacent metal layer. A first layer is the lowest metal layer that has y as a preferred orientation while also providing routing resources for signal routing between the cells. A second layer is the nearest metal layer above this first layer. The IC includes a power distribution network for delivering the reference voltage to the power pin.

19 Claims, 8 Drawing Sheets

(56) References Cited

U.S. PATENT DOCUMENTS

| | | | |
|---|---|---|---|
| 2012/0313185 A1* | 12/2012 | Abe | H01L 27/0207 257/390 |
| 2013/0063203 A1* | 3/2013 | Utsumi | G11C 5/063 327/530 |
| 2014/0175565 A1 | 6/2014 | Smayling et al. | |
| 2014/0229908 A1 | 8/2014 | Sherlekar et al. | |
| 2015/0357282 A1* | 12/2015 | Lau | H01L 23/5226 257/401 |

* cited by examiner

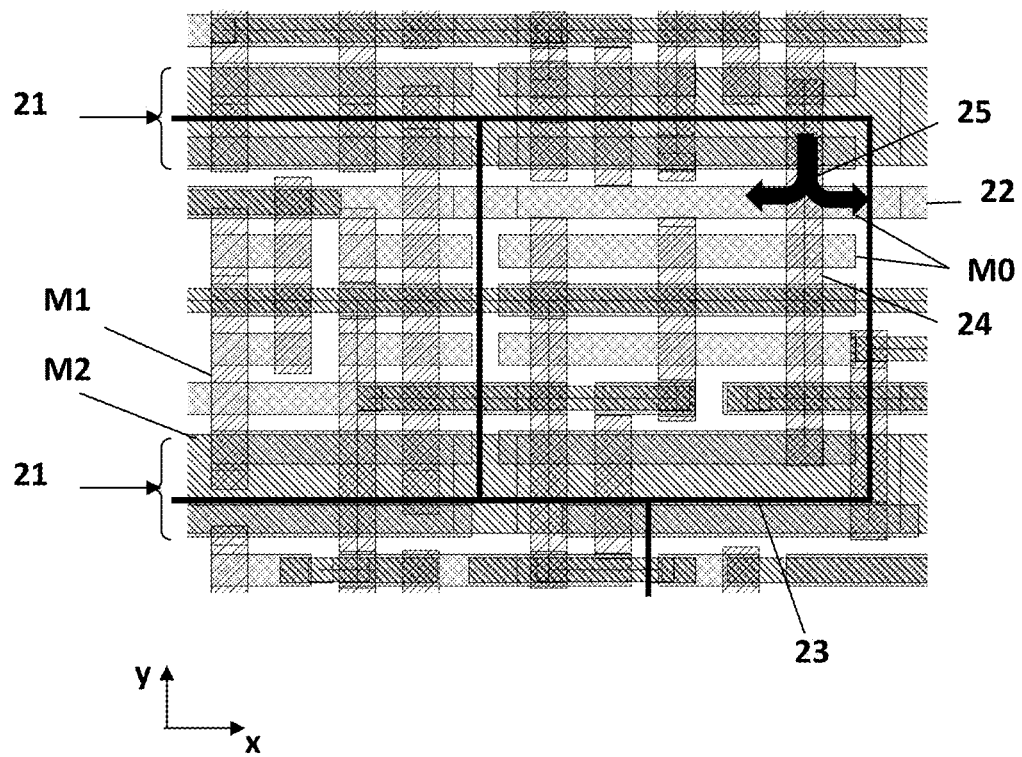
FIG 3 – PRIOR ART
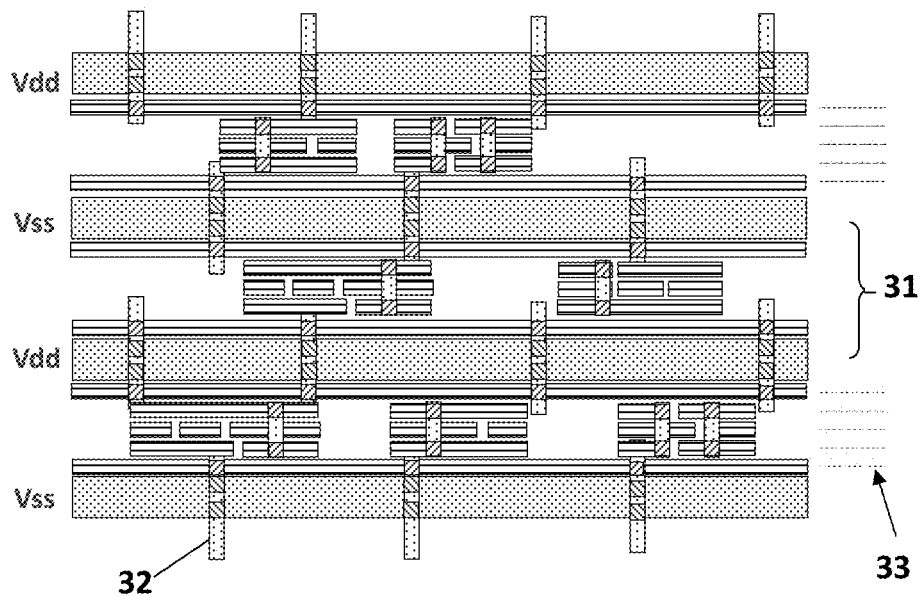
FIG 4 – PRIOR ART

INTEGRATED CIRCUIT POWER DISTRIBUTION NETWORK

RELATED APPLICATIONS

This application claims priority to European application no. EP 16164134.5, entitled "INTEGRATED CIRCUIT POWER DISTRIBUTION NETWORK," filed on Apr. 6, 2016, and incorporated herein by reference in its entirety.

BACKGROUND

Technological Field

The disclosed technology relates to integrated solid state semiconductor devices using standard-cell design methodologies, and particularly to an integrated circuit power distribution network, and a related method of manufacture.

Description of the Related Technology

Standard-cell design in current high-performance CMOS platform technology involves tight contacted poly pitch constraints and metallization pitch constraints. Standard-cell architectures can have predetermined cell track heights, such as 9-track, 7.5-track or 6-track standard-cell libraries, for example, for 32 nm metallization pitch technology. Self-aligned double patterning and self-aligned quadruple patterning techniques used for state-of-the-art device manufacture impose strict design constraints.

In standard-cell methodology, multiple standard cells are arranged in at least one row in a front-of-the-line portion of the device, for example, on a bottom portion of the device manufactured directly in and on the semiconductor substrate. Current standard cell technology can also involve a middle-of-line portion for enabling an efficient internal layout of the standard cells. This middle-of-line portion can include a metal layer for internal routing of signals and/or power supply in the standard cell. This middle-of-line portion can include a power rail to provide efficient source and/or drain power tapping at the lowest level in the power distribution architecture. For example, current 7.5-track cells can be designed with such inbound Vss/Vdd power rail in a metal layer of the middle-of-line portion.

A power distribution network is typically provided in integrated circuit devices to supply a ground and power supply voltage pair to the solid state devices integrated in and/or on the semiconductor substrate. For example, power can be supplied to transistors provided in the front-of-the-line portion of the device. This power distribution network can receive a voltage pair from external connections provided at a top level of the semiconductor stack and route these voltages via metal tracks provided in metal layers and interconnected by vias to a level where the semiconductor transistors of the integrated device are arranged, such as a lowest level of the network near the semiconductor substrate at the bottom of the stack.

In a prior art device, as shown in, FIG. 3 wide power rails 21 are provided in a metal layer M2. These power rails run perpendicular to the gate orientation y of the standard cells 23. The metal layer M2, the first metal layer having tracks in this direction x above the intra-cell integration level, above the front-end-of-the-line (FEOL) and middle-of-line (MOL) levels, and above a middle-of-line internal routing layer M0 that provides an interface between the low-level cell components and the cell integration wiring of the back-of-the-line (BEOL), could provide valuable routing resources which are consumed by such power rail structures 21. These wide power rails 21 can be provided at a periodicity along the direction y corresponding to the cell height, for example at cell height frequency. The width of these power rails can be constrained by design requirements, such as, to 3 critical dimensions (CD), as required by self-aligned quadruple patterning technology.

In such prior art devices, internal power rails 22, as part of the standard cell 23, can run along the direction x in the internal routing layer M0. These internal power rails can be connected to abutting or otherwise adjacent cells in the row direction x. These internal power rails can be connected by vias to short, interconnecting metal traces 24 oriented along the direction x in a metal layer M1, which provide the connection by vias to the power rails 21 in metal layer M2. Thus, power is transferred, as indicated by the bold arrows 25 in FIG. 3 from metal layer M2, via the stitching straps 24 in metal layer M1, to the internal power rail 22 in the internal routing layer M0. A disadvantage of this approach is that, for a 7.5-track cell, only 5 of the 7.5 tracks on metal layer M2 can be available for signal routing, while the rest is consumed by power routing.

In particular, current 7.5 track-height cells can be designed with such internal inbound Vdd and Vss power rails 22 to provide easy power tapping to the source and drain regions of the transistors integrated in the standard cell. Furthermore, it is also known in the art to design 6 track-height cells having an outbound buried power rail to free up some of the resources used in the M2 layer for signal routing.

SUMMARY OF CERTAIN INVENTIVE ASPECTS

An objective of the disclosed technology is to provide good and efficient means of power routing in integrated circuit semiconductor devices. This objective is accomplished by a method and device according to the disclosed technology.

One advantage of the disclosed technology is that routing resources in the lowest metal routing layers in a semiconductor stack are available for signal routing in a direction perpendicular to the gate orientation and parallel to the substrate. Other advantages include good port access for signal routing, and small chip size.

One aspect is an integrated circuit device. The integrated circuit device includes a stack of layers and a semiconductor substrate forming a bottom level of this stack. The integrated circuit device includes multiple standard cells, each standard cell including a plurality of integrated transistors and interconnecting structures for locally interconnecting the transistors such as to provide a predetermined function of the standard cell. The standard cells include parallel gate structures oriented in a first direction that is parallel to the substrate. The standard cell, for example each standard cell, includes at least one internal power pin, for example a power connector that is internal in the cell, for supplying a reference voltage to contacts of the integrated transistors in accordance with the predetermined function of the standard cell. The stack of layers further includes a plurality of metal layers in which conductive metal lines are formed to route signals between the standard cells. The metal lines in each metal layer have a preferred orientation, in which each metal layer has a preferred orientation that is orthogonal to the preferred orientation of the metal lines in an adjacent metal layer of the plurality of metal layers.

A first metal layer, a vertical metal layer, or a first vertical metal layer of the plurality of metal layers is the lowest metal layer in the stack that has the first direction as preferred orientation and that provides routing resources for signal routing between the standard cells. A second metal layer, for example a horizontal metal layer, for example a second horizontal metal layer, of the plurality of metal layers is the nearest metal layer above the first vertical metal layer in the stack.

The integrated circuit device further includes a power distribution network for delivering the reference voltage to the at least one internal power pin. For any conductive path in this power distribution network, in which the conductive path electrically connects a further metal layer above the second horizontal metal layer to the at least one internal power pin, any portion of this conductive path, in which the portion is contained within the second horizontal metal layer, covers less than the width of the standard cell in a second direction orthogonal to the first direction.

In an embodiment, the at least one internal power pin includes a buried power rail.

In an embodiment, the at least one internal power pin includes an internal power rail extending in the second direction. The internal power rail can be provided in a local interconnect metal layer of the standard cells.

In an embodiment, the stack includes at least one layer fabricated using multiple patterning, such as LELE, LELELE or such. In an embodiment, the at least one layer can be fabricated using self-aligned double patterning or self-aligned quadruple patterning.

In an embodiment, the power distribution network includes at least one power rail oriented along the first direction and provided in the first vertical metal layer.

In an embodiment, the power distribution network includes at least one power rail oriented along the first direction and provided in a third vertical metal layer of the plurality of metal layers. The third vertical metal layer refers to the nearest metal layer above the second horizontal metal layer in the stack.

In an embodiment, the power distribution network includes at least one power staple in the second horizontal metal layer for electrically connecting the power rail in the third vertical metal layer to the power rail in the first vertical metal layer.

In an embodiment, the second horizontal metal layer has a larger pitch than the smallest pitch of the other metal layers in the stack.

In an embodiment, the second horizontal metal layer has a larger pitch than the smallest pitch of the other horizontal metal layers in the stack.

In an embodiment, the power distribution network includes at least one power strap oriented along the second direction. This at least one power strap can be provided in a horizontal metal layer above the first vertical metal layer, such as in the second horizontal metal layer. This at least one power strap can be adapted for locally connecting, such as electrically interconnecting, two power rails that are oriented along the first direction and provided in the first vertical metal layer. The, or each, at least one power strap can for example electrically connect at most four power rails oriented along the first direction and provided in the first vertical metal layer. The, or each, at least one power strap can for example electrically connect at most two power rails oriented along the first direction and provided in the first vertical metal layer. These at most two power rails can be two adjacent or neighboring, power rails for carrying the same reference voltage. The at least one power strap can form part of a conductive path electrically connecting a further metal layer above the second horizontal metal layer to the at least one internal power pin. Alternatively, the at least one power strap can form part of a conductive path electrically connecting a further metal layer above the second horizontal metal layer to a further internal power pin, as described below.

In an embodiment the integrated circuit device includes at least one further standard cell that includes a plurality of integrated transistors and interconnecting structures for locally interconnecting the transistors such as to provide a predetermined function of the further standard cell. The further standard cells can include parallel gate structures oriented in the first direction. The further standard cell can include at least one further internal power pin, for example a power connector that is internal in the further standard cell, for supplying a reference voltage to contacts of the integrated transistors in accordance with the predetermined function of the further standard cell. The power distribution network can be adapted for delivering the reference voltage to the at least one further internal power pin. The at least one power strap can form part of a conductive path electrically connecting a further metal layer above the second horizontal metal layer to the at least one further internal power pin. The at least one power strap can have a length that covers less than 129 times, 65 times, 33 times, 17 times, 5 times, 4 times, 3 times or 2 times the width of the further standard cell in the second direction. The at least one power strap can have a length that covers less than an entire cell row of the integrated circuit device, for example less than or equal to 50%, 25%, 10% or 5% of the entire cell row.

In an embodiment, the second horizontal metal layer has a larger pitch than the smallest pitch of the vertical metal layers in the stack.

A second aspect is a method for manufacturing an integrated circuit device, such as an integrated circuit device in accordance with embodiments of the first aspect of the disclosed technology. The method includes providing a stack of layers and a semiconductor substrate forming a bottom level of this stack. The method can include providing a semiconductor substrate and stacking a plurality of layers thereon. The method further includes fabricating multiple standard cells, each standard cell including a plurality of integrated transistors and interconnecting structures for locally interconnecting the transistors such as to provide a predetermined function of the standard cell. The standard cells include parallel gate structures oriented in a first direction that is parallel to the substrate. The standard cell, for example each standard cell, includes at least one internal power pin for supplying a reference voltage to contacts of the integrated transistors in accordance with the predetermined function of the standard cell.

Providing the stack of layers includes providing a plurality of metal layers in which conductive metal lines are formed to route signals between the standard cells, the metal lines in each metal layer having a preferred orientation, in which each metal layer has a preferred orientation that is orthogonal to the preferred orientation of the metal lines in an adjacent metal layer of the plurality of metal layers. A first vertical metal layer of the plurality of metal layers is provided as the lowest metal layer in the stack, for example of the stack, that has the first direction as preferred orientation and that provides routing resources for signal routing between the standard cells. A second horizontal metal layer of the plurality of metal layers is provided as the nearest metal layer above the first vertical metal layer in the stack.

The method further includes providing a power distribution network for delivering the reference voltage to the at least one internal power pin, such that, for any conductive path in the power distribution network that electrically connects a further metal layer above the second horizontal metal layer to the at least one internal power pin, any portion, of this conductive path, in which this portion is contained within the second horizontal metal layer, covers less than the width of the standard cell in a second direction orthogonal to the first direction, for example the second direction also being parallel to the substrate.

In an embodiment, fabricating the standard cells includes providing an internal power rail extending in the second direction, in which this internal power rail can be provided in a local interconnect metal layer of the standard cells.

In an embodiment, fabricating the standard cells includes providing a buried power rail.

In an embodiment, providing the power distribution network includes providing at least one power rail, oriented along the first direction, in the first vertical metal layer.

In an embodiment, providing the power distribution network includes providing at least one power rail, oriented along the first direction, in a third vertical metal layer of the plurality of metal layers, wherein this third vertical metal layer is the nearest metal layer above the second horizontal metal layer in the stack.

In an embodiment, providing the power distribution network includes providing at least one power staple in the second horizontal metal layer for electrically connecting the power rail in the third vertical metal layer to the power rail in the first vertical metal layer.

BRIEF DESCRIPTION OF THE DRAWINGS

FIG. 3 illustrates a prior art device in which wide power rails running perpendicular to the gate orientation are provided.

FIG. 4 illustrates the availability of routing resources for signal routing in a prior art device as also shown in FIG. 3.

Figure 1:
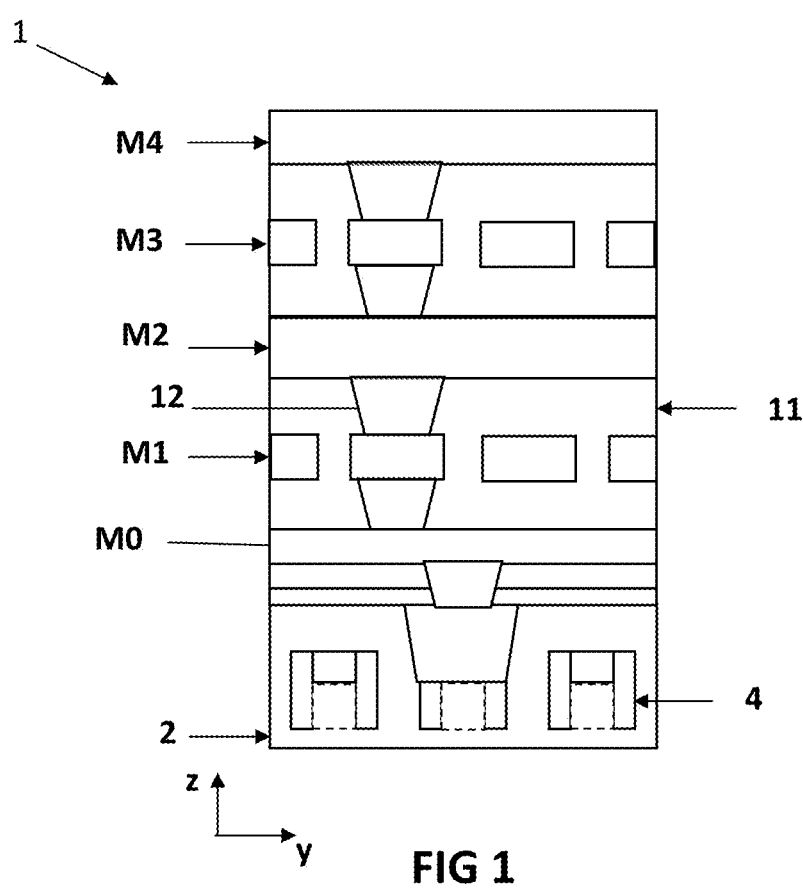
FIG. 1 shows an exemplary stack of layers in an integrated circuit semiconductor device in accordance with embodiments of the disclosed technology.

The drawings are only schematic and are non-limiting. In the drawings, the size of some of the elements may be exaggerated and not drawn on scale for illustrative purposes. Any reference signs in the claims shall not be construed as limiting the scope. In the different drawings, the same reference signs refer to the same or analogous elements.

DETAILED DESCRIPTION OF CERTAIN ILLUSTRATIVE EMBODIMENTS

The present invention will be described with respect to particular embodiments and with reference to certain drawings but the invention is not limited thereto but only by the claims. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

Reference throughout this specification to "one embodiment" or "an embodiment" means that a particular feature, structure or characteristic described in connection with the embodiment is included in at least one embodiment of the disclosed technology. Thus, appearances of the phrases "in one embodiment" or "in an embodiment" in various places throughout this specification are not necessarily all referring to the same embodiment. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the disclosed technology, various features are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this disclosed technology.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the disclosed technology can be practiced without these specific details. In other instances, well-known methods, structures and techniques have not been shown in detail in order not to obscure an understanding of this description.

Figure 2:
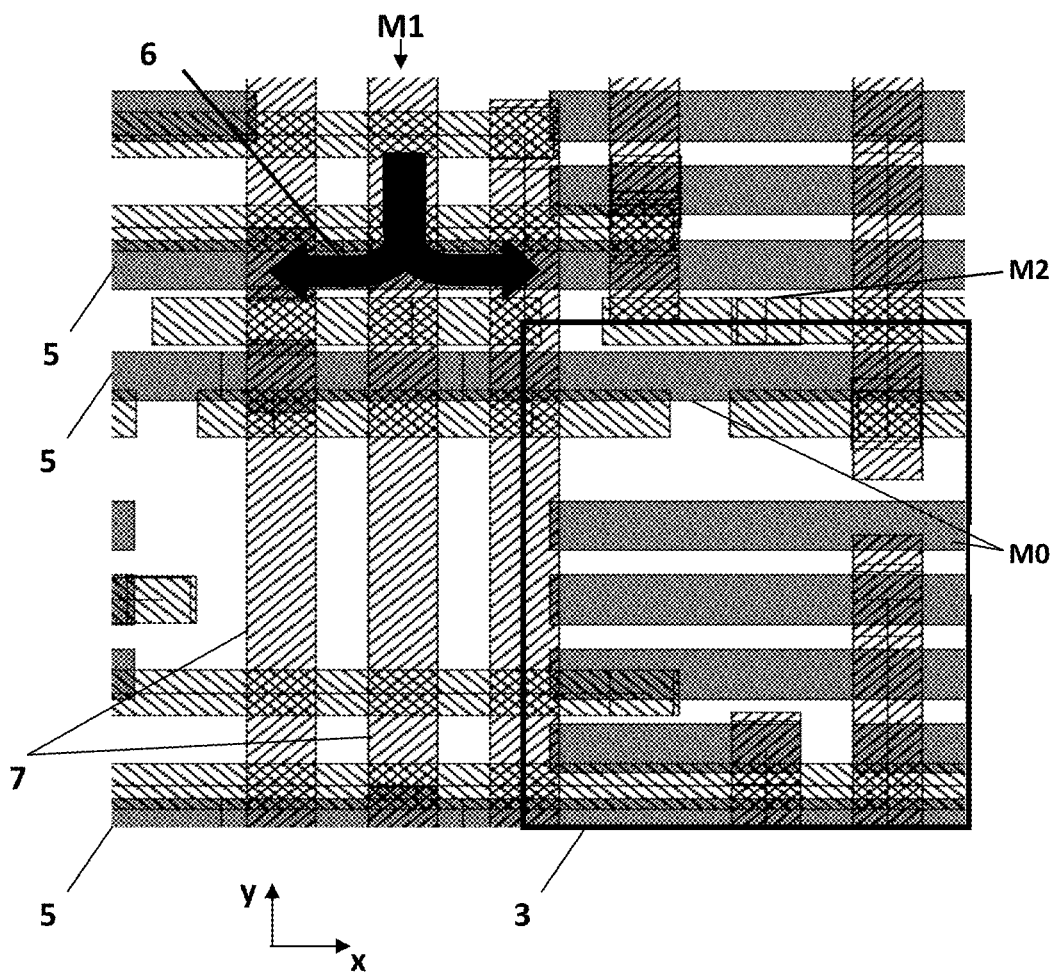
FIG. 2 shows an exemplary device in accordance with embodiments of the disclosed technology.

A first aspect of the disclosed technology is an integrated circuit (IC) device including a stack of layers and a semiconductor substrate forming a bottom level of the stack. For example, FIG. 1 includes semiconductor layer 2 and metal layers M0, M1, M2, M3 and M4. An embodiment may include fewer or more layers than the integrated circuit device of FIG. 1. The IC device includes multiple standard cells, in which each standard cell includes a plurality of integrated transistors and interconnecting structures for locally interconnecting the transistors, such as to provide a predetermined function of the standard cell, such as standard cell 3 in FIG. 2. Each layer extends in the x and y dimensions, as shown in FIG. 2 with overlapping layers. FIG. 1 shows layers stacked in the z dimension.

It will be clear to the person skilled in the art that the integrated circuit device may be an integrated circuit chip, but can also relate to only a part of the integrated circuit in such integrated circuit chip. For example, an integrated circuit device in accordance with embodiments of the disclosed technology is not necessarily limited to an entire chip device, but could be only a part of a larger integrated circuit, for example a subunit including adjacent cells, for example a cell row, a plurality of adjacent cell rows, a cell column, a plurality of adjacent cell columns and/or a block of adjacent standard cells. Such subunit can include substantially a majority of the cells in the entire device. In another part of such chip, for example different from a subunit in accordance with embodiments of the disclosed technology, another power distribution network structure can be implemented, for example including a conventional power rail in a second horizontal layer. For example, the other part of the chip can have abundantly available routing resources for locally implementing the intended functionality of this other part. Such other part can for example merely implement a simple header structure. For example, in a memory chip device, the power distribution network for memory macros and logic circuits can be implemented differently, whereas the integrated circuit in accordance with embodiments of the disclosed technology can only relate to the logic circuits. However, embodiments of the disclosed technology relating to memory devices are not necessarily limited to only the logic circuits in such memory device. In another example, I/O pads of a mixed signal integrated circuit can have a specific power distribution network structure, as known in the art, yet such mixed signal ICs can include an integrated circuit device in accordance with embodiments of the disclosed technology for implementing the logic circuitry. However, embodiments of the disclosed technology relating to a mixed signal integrated circuit device are not necessarily limited to only the logic circuits in such mixed signal integrated circuit device.

In other words, in an integrated circuit device in accordance with embodiments of the disclosed technology, at least one internal power pin is included, in which for any conductive path in the power distribution network electrically connecting a further metal layer of the plurality of metal layers to the at least one internal power pin, any portion of this conductive path that is contained within the second horizontal metal layer covers less than the width the standard cell, as described in detail further hereinbelow. However, this does not preclude the presence of another power pin in a different part of the device, or even a further power pin in the same part of the device, that is supplied by another power distribution network structure, such as a conventional power distribution network, or even supplied by a part of the same power distribution network as the network supplying the at least one internal power pin.

The predetermined function can include a primitive signal processing function, such as a logic function. The predetermined function can include a physical function, such as provided by a filler cell, a decap cell or a header cell. The predetermined function can include a signal storage function.

The standard cells include parallel gate structures oriented in a first direction parallel to the substrate. The standard cell further includes at least one internal power pin for supplying a reference voltage to contacts of the integrated transistors in accordance with the predetermined function of the standard cell. This reference voltage can relate to any or each of a plurality of reference voltages, for example a supply voltage and a ground voltage. For example, an internal power pin can be adapted for supplying a supply voltage and/or a ground voltage. The internal power pin can be adapted for supplying such reference voltage to source and/or drain and/or gate contacts of at least some of the integrated transistors in accordance with the predetermined function of the standard cell. However, in accordance with embodiments of the disclosed technology, the reference voltage can equally relate to more than two reference voltages, for example a −5V voltage, a +3.3V voltage and a +5V voltage. A reference voltage can for example be characterized as a voltage which is not changing in time such as to encode information to be processed by the integrated circuit.

The stack of layers further includes a plurality of metal layers in which conductive metal lines are formed to route signals between the standard cells, in order to route signals between and/or inside the standard cells. The metal lines in each metal layer have a preferred orientation. Each metal layer has a preferred orientation that is orthogonal to the preferred orientation of the metal lines in an adjacent metal layer of the plurality of metal layers, for example a neighbouring metal layer in the stack of layers.

It is to be understood that 'adjacent' and/or 'neighbouring' does not require that such layers are provided in direct physical contact. For example, as is known in the art, the adjacent and/or neighbouring metal layers can be separated by at least one insulating material layer, but, for example, not by an intermediate metal layer. It is also understood that such insulating material layer can be penetrated by a conductive structure, for example a via structure, to electrically connect a metal layer above the insulating material layer to a metal layer below the insulating material layer without the conductive material layer therefore being considered as a metal layer even if such local conductive structure includes a metal element as this would not be consistent with common usage and understanding of the wording 'metal layer' in the art.

A first vertical metal layer of the plurality of metal layers is the lowest metal layer in the stack that has the first direction as preferred orientation and that provides routing resources for signal routing between the standard cells. However, signal routing in the first vertical metal layer is not necessarily limited to routing between standard cells. Intra-cell signal routing can also be provided via the first vertical metal layer. The first vertical metal layer can be the lowest metal layer of the metal layers in the stack that satisfies simultaneously the condition of having the first direction as preferred direction and the condition of providing routing resources for signal routing between standard cells. Here, 'vertical' merely refers to the preferred orientation of this metal layer being in the first direction, which can also be referred to as the vertical direction. 'Vertical' thus does not imply a further limitation, other than the preferred orientation being in the first direction. Reference to the 'first vertical metal layer' can thus be made by simply referring to the 'first metal layer' without loss of generality. Furthermore, 'first' in the expression 'first vertical metal layer' does not imply a further limitation other than what is already implied by the layer being the lowest vertical metal layer in the stack that provides routing resources for signal routing between standard cells.

A metal layer providing routing resources for signal routing between standard cells can refer to a metal layer including at least one conductive path for connecting a signal output port, of a first standard cell to a signal input port of a second standard cell. The signal output port of the first standard cell can be a drain, source and/or gate contact. The signal input port of the second standard cell can be a drain, source and/or gate contact. Here, signal routing can refer to providing a signal that can change in time to encode information to be processed by the integrated circuit as opposed to the reference voltage described hereinabove.

A second horizontal metal layer of the plurality of metal layers is the nearest metal layer above the first vertical metal layer in the stack, thus having a preferred orientation in a second direction orthogonal to the first direction. Here, 'horizontal' merely refers to the preferred orientation of this metal layer being in the second direction, which can also be referred to as the horizontal direction. 'Horizontal' thus does not imply a further limitation, other than the preferred orientation being in the second direction. Reference to the 'second horizontal metal layer' can thus be made by simply referring to the 'second metal layer' without loss of generality. Furthermore, 'second' in the expression 'second horizontal metal layer' does not imply a further limitation other than what is already implied by the layer being the nearest metal layer above the first vertical metal layer in the stack. In particular embodiments of the disclosed technology, the second horizontal metal layer can be the second metal layer, when counting from the bottom of the stack, that has the second direction as preferred direction and that provides routing resources for signal routing between the standard cells. However, this limitation is not necessarily implied for all embodiments of the disclosed technology by merely using the wording 'second horizontal metal layer'.

The integrated circuit device includes a power distribution network for delivering the reference voltage, such as a supply voltage and/or a ground voltage, to the at least one internal power pin. For any conductive path in this power distribution network, in which this conductive path electrically connects a further metal layer of the plurality of metal layers to the at least one internal power pin, the further metal layer being arranged above the second horizontal metal layer, any portion, of this conductive path, that is contained within the second horizontal metal layer covers less than the width the standard cell in a direction orthogonal to the first direction, for example in the second direction, for example less than 75%, less than 50%, less than 25%, or less than 10% of the width of the standard cell. In other words, the power distribution network cannot include a power rail structure spanning over multiple standard cells in the second horizontal metal layer, for example over at least two standard cells, insofar relating to a part of the power distribution network supplying the reference voltage to the at least one internal pin.

Referring to FIG. 2, an exemplary integrated circuit device 1 according to embodiments of the disclosed technology is shown. This integrated circuit device 1 includes a semiconductor substrate 2 forming a bottom level of a stack, and a plurality of layers provided on the substrate, as schematically illustrated in the cross-sectional view shown in FIG. 1. This stack can include at least one layer fabricated using multiple patterning. The stack can include at least one layer fabricated using self-aligned double patterning or self-aligned quadruple patterning.

The IC device 1 includes multiple standard cells 3. As known in the art, these standard cells can be arranged in at least one row or in a plurality of rows.

In an embodiment, the standard cells can be provided in a lower portion of the device that corresponds to a front-end-of-the-line portion, or to a front-end-of-the-line and middle-of-line portion, of the device. The plurality of metal layers can refer to the metal layers in a back-end-of-the-line portion of the device, or to the metal layers used for signal and/or power routing in the back-of-the-line portion of the device. The front-end-of-the-line portion can include source and drain regions of the plurality of integrated transistors and a middle-of-the-line portion can include a gate electrode, contact electrodes to the source and drain, a local power rail and/or other intra-cell electrically interconnecting features.

Each standard cell 3 includes a plurality of integrated transistors 4 and interconnecting structures for locally interconnecting the transistors. For example, the standard cell can have a complementary metal oxide semiconductor architecture, including at least one NMOS and at least one PMOS region having transistor elements defined therein. The interconnecting structures can include conductive structures, for example metal structures, for directly contacting a source and/or drain region of at least one transistor. The interconnecting structures can include conductive structures, such as metal and/or polysilicon structures, for directly contacting a gate region of at least one transistor. The interconnecting structures can include conductive structures, such as metal structures, for providing single routing inside the standard cell, for example to connect predetermined gate, source and/or drain regions of a plurality of transistors inside the standard cell.

These integrated transistors and interconnecting structures are adapted for providing a predetermined function of the standard cell. This predetermined function can include a primitive signal processing and/or signal storage function of the standard cell, for example a memory function, such as a flip-flop or latch function, or a Boolean logic function, such as an AND, OR, XOR, NAND, XNOR or inverter operation. As is known in the art, the standard cell can provide a primitive function of some complexity, for example a muxed D-input flipflop or a two-bit full-adder. The function of a standard cell can for example be represented by a truth table, a Boolean algebra equation, or a state transition table. However, the predetermined function can also relate to a physical function, such as to provide a header or as a filler.

The standard cells include parallel gate structures oriented in a first direction parallel to the substrate, which can be referred to as a gate direction or 'vertical' direction in a plane parallel to the substrate.

The standard cells can have a predetermined height, for example a height defined as a integer or non-integer multiple of tracks, in the first direction. The standard cells can have a track height of 6T or 7.5T. For example the standard cells can be 6-track cells or 7.5-track cells.

The standard cell further includes at least one internal power pin 5 for supplying a reference voltage to contacts of, for example, at least some of the integrated transistors in accordance with the predetermined function of the standard cell. This reference voltage can include a supply voltage and/or a ground voltage. At least one internal power pin can be adapted for supplying a ground voltage to at least a first contact of an integrated transistor, and at least one internal power pin can be adapted for supplying a power supply voltage to at least a second contact of an integrated transistor. 'Internal power pin refers to an electrical connection node, and does not imply any particular properties in terms of shape, geometry and/or size of such connector. The contacts of the integrated transistors can include source, drain and/or gate contacts.

In accordance with embodiments of the disclosed technology, the at least one internal power pin 5 can include a buried power rail. For example, state-of-the-art 6-track cells can include an outbound buried power rail to provide more available signal routing resources in the metal layers of the back-of-the-line portion of the device.

In accordance with embodiments of the disclosed technology, this at least one internal power pin 5 can include an internal power rail extending in the second direction x parallel to the substrate and orthogonal to the first direction y. This internal power rail can be provided in a local interconnect metal layer M0 of the standard cell. This interconnect metal layer M0 can refer to a middle-of-line metal layer to provide an interface between the front-end-of-the-line portion of the cell that includes the transistors and the back-of-the-line portion of the device that interconnects the cells into an operational device. For example, the interconnect metal layer M0 can be the lowest metal layer in the stack that has the second direction x as preferred orientation and that provides routing resources for signal routing between the standard cells. However, signal routing in the interconnect metal layer M0 is not necessarily limited to routing between standard cells. Intra-cell signal routing can be provided via the interconnect metal layer M0. The interconnect metal layer M0 can be the lowest metal layer in the stack that simultaneously satisfies the conditions of: having the second direction x as preferred orientation, and of providing routing resources for signal routing between the standard cells. In other words, in analogy to what was already discussed hereinabove in relation to the first vertical layer M1, the interconnect metal layer M0 can be the lowest horizontal metal layer that includes at least one conductive path connecting a first standard cell to a second standard cell, for example, for signal and/or power routing. For example, in 7.5-track standard cells, as known in the art, an inbound Vdd and Vss power rail can be provided in the local interconnect metal layer M0, such as to enable efficient source and drain power tapping via local interconnecting structures of the cell.

The stack of layers further includes a plurality of metal layers in which conductive metal lines are formed to route signals between the standard cells. The metal lines in each metal layer have a preferred or primary orientation, for example determined by a minimum spatial feature size, such as a pitch. The metal layers can be fabricated such that their smallest feature size is available in only one direction. The smallest trace width and spacing may be available in only the preferred direction along the plane of the metal layer. Nevertheless, due to conventional orthogonal wiring methodology, even if the smallest trace width in a metal layer can be achieved in two orthogonal directions, the metal lines in a single layer can be laid out in predominantly a single direction, the preferred direction, in which this preferred direction alternates between two perpendicular directions in the plane over neighbouring metal layers.

Each metal layer has a preferred orientation that is orthogonal to the preferred orientation of the metal lines in an adjacent metal layer of the plurality of metal layers. The metal layers can alternate between a preferred track orientation in the first direction y and in the second direction x.

The plurality of metal layers can correspond to metal layers in a back-end-of-the-line portion of the semiconductor device 1, while the standard cells can correspond to structures formed in a front-end-of-the-line portion, or a front-and-of-the line portion and middle-of-line portion, of the semiconductor device 1.

A first, vertical, metal layer M1 of the plurality of metal layers is the lowest metal layer in the stack that has the first direction y as preferred orientation of the metal tracks provided therein, and that provides routing resources for signal routing between the standard cells. A second, horizontal, metal layer M2 of the plurality of metal layers is the nearest metal layer above the first, vertical, metal layer M1 in the stack. Likewise, reference to a third, vertical, metal layer M3 in present description refers to is the nearest metal layer above the second, horizontal, metal layer M2 in the stack, and reference to a fourth, horizontal, metal layer M4 in present description refers to is the nearest metal layer above the third, vertical, metal layer M3 in the stack, as shown in FIG. 1. Likewise, the interconnect metal layer M0, referred to above, can be a horizontal metal layer of the plurality of metal layers that is the nearest metal layer below the first vertical metal layer M1 in the stack.

As will be understood by the person skilled in the art, the metal layers can be separated from each other by electrically insulating layers 11. Via layers can be locally provided with conductive structures 12 to allow current to pass in a substantially normal direction z with respect to the substrate between the metal layers, by way of via structures.

The integrated circuit device further includes a power distribution network for delivering the reference voltage, such as a supply voltage and/or a ground voltage, for example Vdd and Vss, to the at least one internal power pin 5.

Furthermore, for any conductive path in the power distribution network that electrically connects a further metal layer above the second horizontal metal layer M2 to the at least one internal power pin 5, any portion of such conductive path that is entirely contained within the second horizontal metal layer M2 covers less than the width the standard cell in a direction orthogonal to the first direction y. The direction orthogonal to the first direction y can be the second direction x. The portion of the conductive path that is entirely contained within the second horizontal metal layer M2 can cover less than 75%, 50%, 25%, or 10% of the width of the standard cell. The width of the standard cell can refer to the width of the standard cell directly underneath in a normal direction z with respect to the substrate. The width can refer to a spatial dimension in the second direction x, which is orthogonal to the first direction y and the normal direction z.

Conventional circuit designs that including at least one power rail, such as power rails for Vdd and Vss, provided in second horizontal metal layer M2 has the disadvantage of consuming a substantial amount of routing resources. Furthermore, design rules such as self-aligned quadruple patterning rules can restrict the track width of such power rails, for example to 3 CD, such that optimization of the routing design can be difficult in such prior art arrangements.

In an arrangement where the transistor gates of the standard cells are oriented along the first direction y, device ports can be preferably accessed via signal tracks along the second direction x, parallel to the substrate and perpendicular to the first direction y. In standard cells having a small track height, such as less than 9 tracks in height, port access to gate, source and/or drain regions of the transistor devices along the second direction x can be difficult in devices as known in the art due to power rails provided on the first back-of-the-line metal level with preferred direction along this second direction x, such as in the second horizontal metal layer M2. This implies a disadvantageously large chip size, which can be avoided by a device in accordance with embodiments of the disclosed technology.

A power distribution network in an integrated circuit device according to embodiments of the disclosed technology can include at least one power rail 7 oriented along the first direction y and provided in the first vertical metal layer M1. This at least one power rail 7 can be formed over a plurality of the standard cells, such as to cover multiple rows of standard cells.

For example, as illustrated in FIG. 2, the at least one internal power pin 5 can include at least one internal power rail, oriented in the direction x, that is provided in a local interconnect metal layer M0 of the standard cell. Such internal power rail(s) can form the lowest level of power distribution in the semiconductor device, before connecting via branch connections to the semiconductor drain and/or source regions of the standard cell.

The internal power pin 5, for example an internal power rail, can be connected by a via connection to at least one power rail 7 oriented along the first direction y and provided in the first vertical metal layer M1. This at least one power rail 7 can be formed over a plurality of the standard cells, such as to cover multiple rows of standard cells. Thus, power can be transferred, as indicated by the bold arrows 6, from the vertical rails in M1 to the internal power rails in M0. Thus, the tracks in the second horizontal metal layer M2 can be used to a large extent, for example exclusively, for signal routing, as opposed to power distribution. However, short metal connections can be provided in M2 to stitch power connection using short straps, to provide power staples, for power routing, and may cover less than the width of the standard cell by such local power connection, for example using power straps, in M2.

Figure 5:
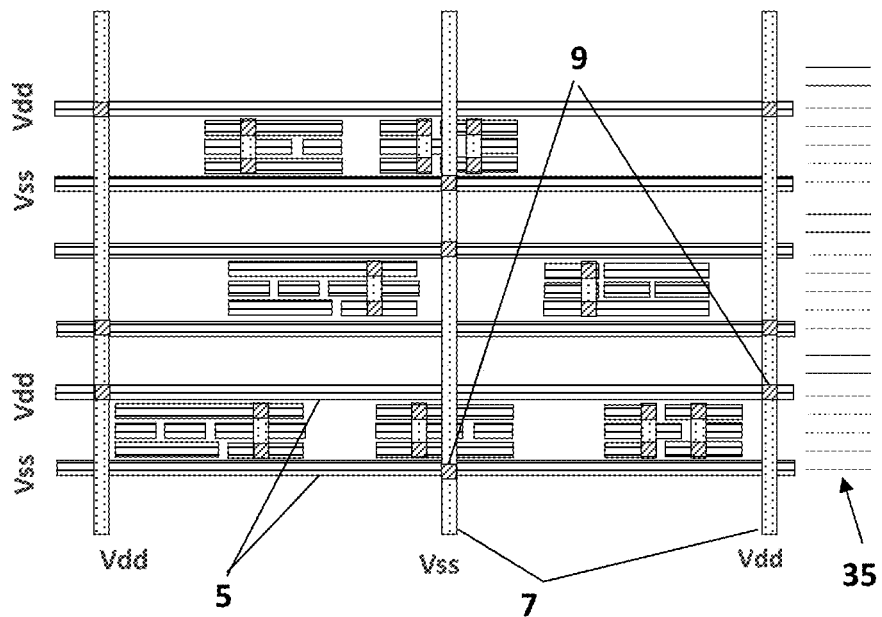
FIG. 5 shows a schematic overview of an exemplary device in accordance with embodiments of the disclosed technology.

A further schematic overview of the exemplary device in accordance with embodiments of the disclosed technology, that was also shown in FIG. 2, is provided in FIG. 5. The at least one power rail 7 in the first vertical metal layer M1 can include parallel power rails that alternatingly provide a supply voltage and a ground voltage, such as Vdd and Vss. Likewise, the at least one internal power pin 5 can include an internal power rail in the local interconnect layer M0, such as parallel internal power rails in M0 that alternatingly provide the supply voltage and the ground voltage. Vias 9 can connect the power rails 7 in the first vertical metal layer M1 to internal power pins 5, for example the internal power rails in the local interconnect layer M0, to connect rails in M1 and M0 that carry the same voltage.

For example, as shown in FIG. 4, in a prior-art power grid arrangement, only 5 of the 7.5 M2 tracks 31, provided in a 7.5-track standard cell architecture, can be free for signal routing, while the rest is used for power routing. For example, the available M2 tracks for signal routing are indicated by the dashed lines 33 in FIG. 4. On the other hand, only a small portion of the M1 routing resources are used by M1 straps 32 for power stitching.

However, in a device in accordance with embodiments of the disclosed technology, substantially all M2 tracks can be available for signal routing, as indicated by the dashed lines 35 in FIG. 5. However, more routing resources can thus be consumed by power routing in the first vertical metal layer M1. Nevertheless, as explained above, due to the gate orientation in the devices, access to source, drain and/or gate ports in the standard cell can preferably be arranged in a direction perpendicular to the gate orientation for efficiency and ease of access.

Figure 7:
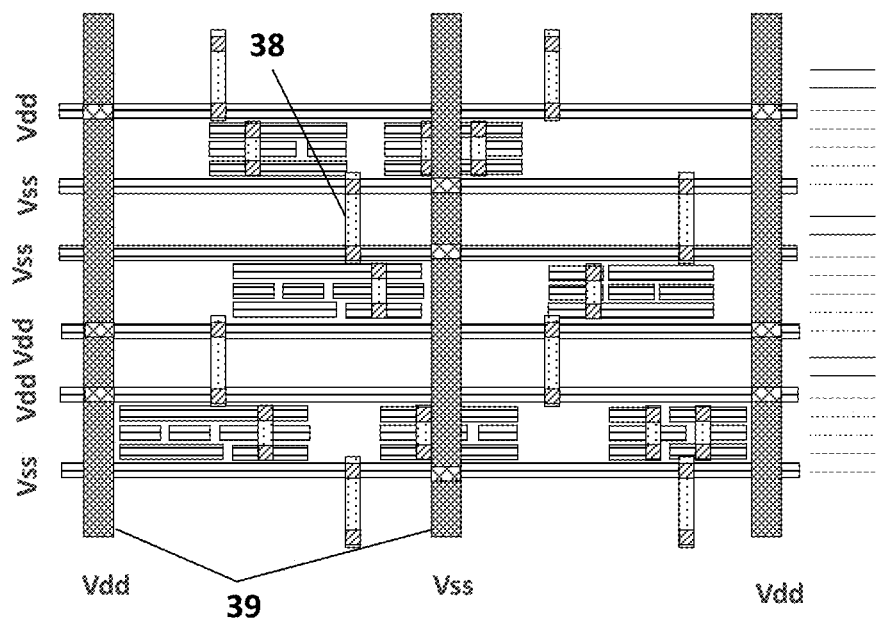
FIG. 7 illustrates a device in accordance with embodiments of the disclosed technology that includes a power rail in a third metal layer.

In accordance with embodiments of the disclosed technology, the power distribution network can include at least one power rail 39 oriented along the first direction and provided in a third metal layer M3 of the plurality of metal layers, as illustrated in FIG. 7. This can provide the next level of power distribution above the first vertical metal layer M1, or even the first level of power distribution above the internal power pin 5, for example above an internal power rail in M0.

In an embodiment, the power distribution network can include at least one power staple in the second horizontal metal layer M2 for electrically connecting a power rail in the third metal layer M3 to a power rail in the first vertical metal layer M1.

In order to advantageously make more routing resources available for signal routing in the first vertical metal layer M1, in addition to an efficient use of routing resources in the second horizontal metal layer M2 in accordance with embodiments of the disclosed technology, the at least one power rail 39 oriented along the first direction and provided in the third metal layer M3 of the plurality of metal layers can be connected, for example by a via stack, directly to the internal power pin 5, to internal power rails in the local interconnect layer M0.

Furthermore, power straps 38 can be provided in the first vertical metal layer M1 to achieve a lower IR-drop, as shown in FIG. 7.

Figure 6:
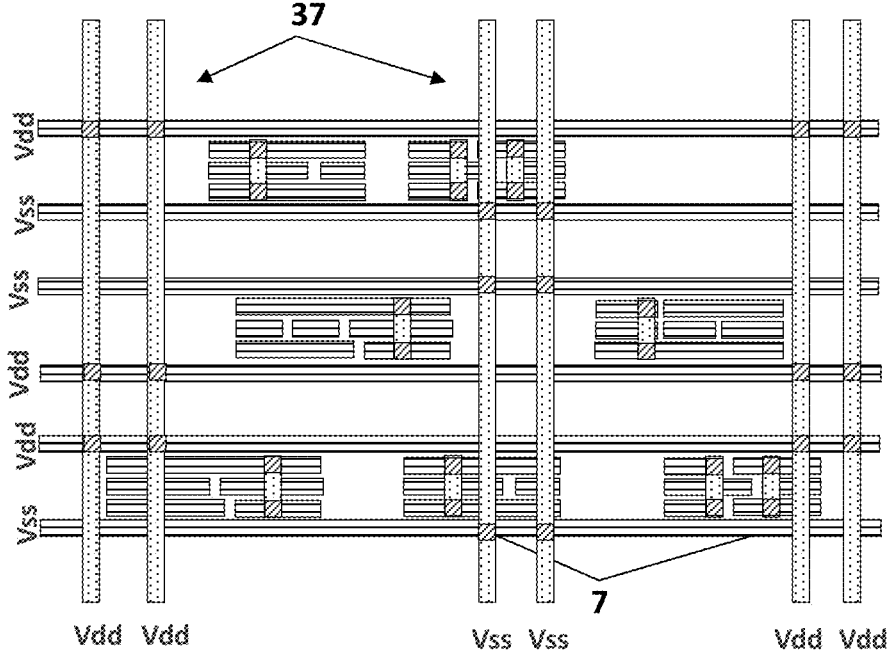
FIG. 6 illustrates pairs of parallel power rails that alternatingly provide a supply voltage and a ground voltage in a device in accordance with embodiments of the disclosed technology.

In an embodiment, the at least one power rail 7 in the first vertical metal layer M1 can include pairs of parallel power rails that alternatingly provide a supply voltage and a ground voltage, such as Vdd and Vss, as shown in FIG. 6. For example, two power rails of a pair 37 of power rails 7 in the first vertical metal layer M1 can be adapted for supplying the same voltage, in which the two power rails of the pair are adjacent, while the voltage carried by neighbouring pairs 37 can alternate between a supply voltage and a ground voltage. Thus, by doubling the power supply in the first vertical metal layer M1, advantageously the impact of static noise and dynamic voltage drops, for example IR and EM noise.

Figure 12:
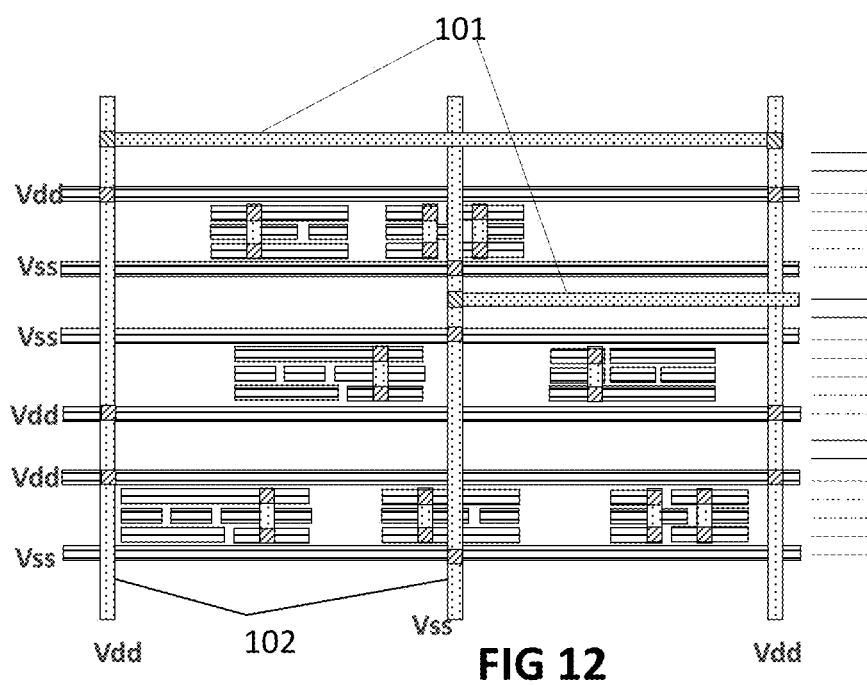
FIG. 12 illustrates a device in accordance with embodiments of the disclosed technology that includes at least one power strap.

In an embodiment, the power distribution network can include at least one power strap 101 as shown in FIG. 12. This at least one power strap 101 can be oriented along the second direction x, and can be provided in a horizontal metal layer above the first vertical metal layer M1 in the second horizontal metal layer M2. This at least one power strap 101 can be adapted for locally connecting, for example electrically interconnecting, two power rails 102 that are oriented along the first direction y and provided in the first vertical metal layer M1. At least one power strap can electrically connect at most four power rails oriented along the first direction and provided in the first vertical metal layer. At least one power strap can electrically connect at most two power rails oriented along the first direction and provided in the first vertical metal layer. These at most two power rails can be two adjacent or neighboring power rails for carrying the same reference voltage.

The at least one power strap can form part of a conductive path electrically connecting a further metal layer above the second horizontal metal layer to the at least one internal power pin. Alternatively, the at least one power strap can form part of a conductive path electrically connecting a further metal layer above the second horizontal metal layer to a further internal power pin.

An integrated circuit device in accordance with embodiments of the disclosed technology can include at least one further standard cell that includes a plurality of integrated transistors and interconnecting structures for locally interconnecting the transistors such as to provide a predetermined function of the further standard cell. The further standard cells can include parallel gate structures oriented in the first direction. The further standard cell can include at least one further internal power pin, such as a power connector that is internal in the further standard cell, for supplying a reference voltage to contacts of the integrated transistors in accordance with the predetermined function of the further standard cell. Likewise as discussed in present description in relation to the at least one internal power pin 5, the at least one further power pin can include an internal power rail, for example in the local interconnect layer M0, and/or a buried power rail.

The power distribution network can be adapted for delivering the reference voltage to the at least one further internal power pin. The at least one power strap can form part of a conductive path electrically connecting a further metal layer above the second horizontal metal layer to the at least one further internal power pin. The at least one power strap can have a length that covers less than 129 times, 65 times, 33 times, 17 times, five times, four times, three times, twice, 150%, or 125% of the width of the further standard cell. The at least one power strap can have a length that covers less than an entire cell row of the integrated circuit device, for example preferably less than or equal to 50%, 25%, 10% or 5% of the entire cell row.

It is an advantage of such power strap arrangement in a device in accordance with embodiments of the disclosed technology that locally a low resistance, and thus a low IR drop can be achieved, and/or that locally a low current density of a power supply current can be achieved, for example to achieve a low electromigration (EM). This can be particularly advantageous to prevent hotspot formation, for example for IR or EM. Thus, even where an advantageous increase in free routing resources, as compared to particular prior art devices, can be achieved by short power routing paths in the second horizontal metal layer M2 in accordance with embodiments of the disclosed technology, an extended power strap can be provided locally in the second horizontal metal layer M2 to prevent hotspots. However, such extended power strap can still be relatively short, such as to prevent a blocking allocation of routing resources over a large area of the device, for example an entire cell row.

In an embodiment, the second horizontal metal layer M2 can have a larger pitch, for example center-to-center distance in the first direction y between the interconnect lines, than the smallest pitch of the other metal layers in the stack, than the smallest (or tightest) pitch of the other horizontal metal layers in the stack, or than the smallest (or tightest) pitch of the vertical metal layers in the stack.

Figure 8:
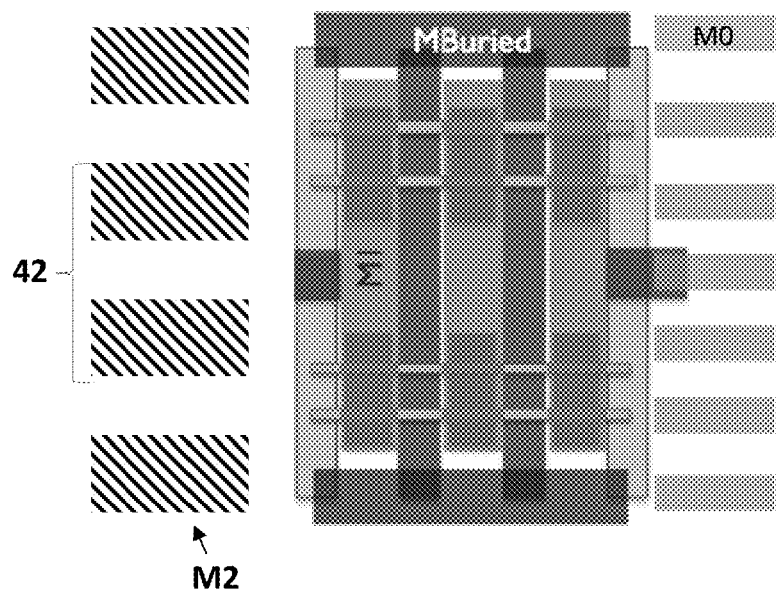
FIG. 8 shows a relaxed pitch in a second horizontal metal layer in a device in accordance with embodiments of the disclosed technology.

For example, while the standard cell can be a 6-track cell having a cell height of 192 nm using 32 nm process technology, the second horizontal metal layer M2 can have a higher pitch, for example providing 4 tracks per row corresponding to a 48 nm pitch. In an embodiment, the second horizontal metal layer M2 can have a relaxed pitch. As shown in FIG. 8, where in a conventional power distribution network as known in the art for such 6-track cell with 4-track M2 pitch, two M2 tracks can be reserved for power rails and only two tracks 42 would be available for signal routing, in accordance with embodiments of the disclosed technology, 4 M2 tracks can be available for signal routing.

In an embodiment, about 20% utilization gain can be achievable when compared to a similar device using M2 power rails as known in the art. Furthermore, by relaxing the pitch of the second, horizontal, metal layer M2, a reduced cost can be achieved, as well as advantageous improvement of capacitance and/or resistance. Furthermore, it is an advantage that good and efficient pin pickup can be achieved.

Figure 9:
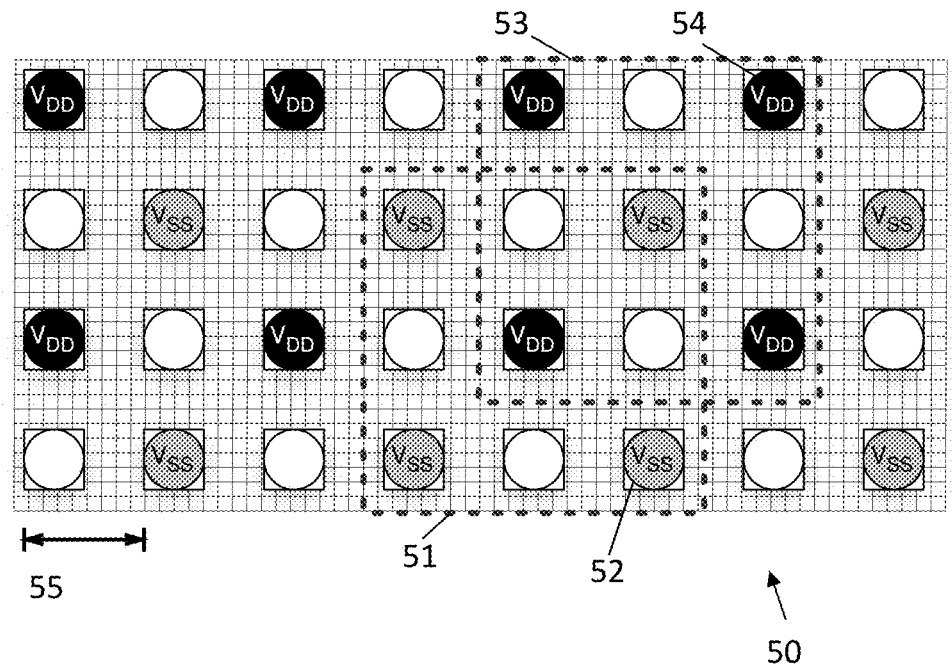
FIG. 9 illustrates a top metal layer to provide external access to the power distribution network in a device in accordance with embodiments of the disclosed technology.

An integrated circuit device 1 in accordance with embodiments of the disclosed technology can include a top metal layer 50, such as a back metal layer forming top level of the stack, that provides external access to the power distribution network, as shown in FIG. 9.

This top metal layer 50 can also provide external access to signal lines extending through the metal layers to input and/or output ports of the standard cells. The top metal layer can include a flip chip region in which access pads are provided for the power distribution network to power and ground voltage supplies in a regular, two-dimensional grid pattern. Access pads 54 for the power voltage supply can form an effective mesh 53 that is diagonally offset with respect an effective mesh 51 formed by access pads 52 for the ground supply voltage, as is known in the art. The access pads in this flip chip region can be provided with a predetermined pad pitch 55, for example of 150 μm, in a two-dimensional regular grid.

Figure 10:
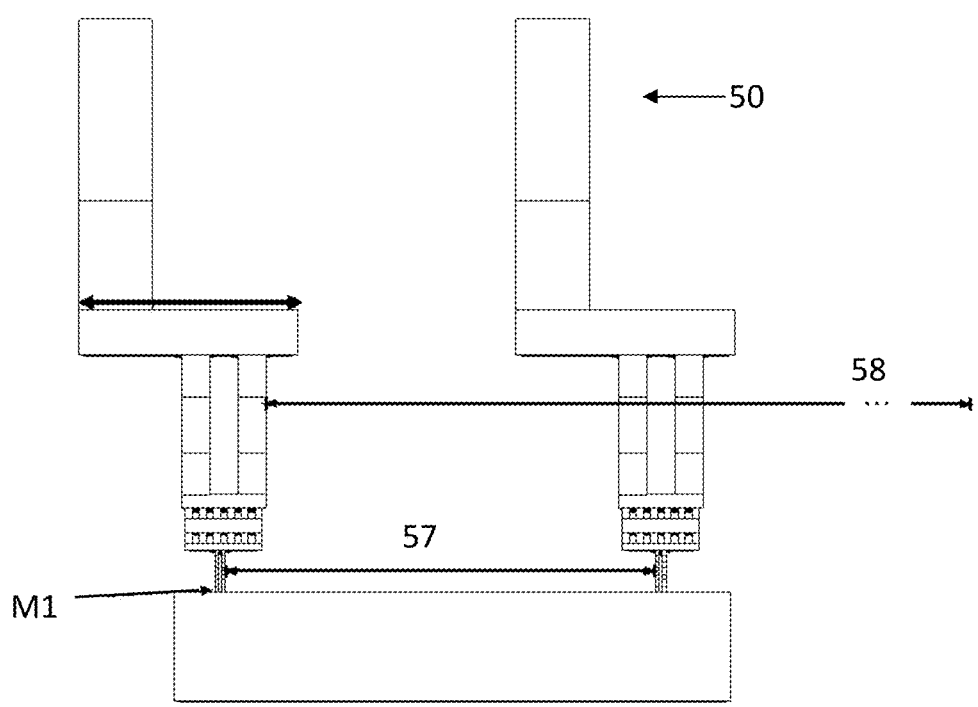
FIG. 10 further illustrates a power distribution network extending down from a top metal layer in a flip-chip power distribution configuration, in accordance with embodiments of the disclosed technology.

As shown in FIG. 10, the power distribution network can extend down from the top metal layer 50 in a power distribution configuration, similar to flip chip power supply networks as known in the art. However, at the lower levels of this network, the power can be supplied in accordance with embodiments of the disclosed technology, for example to power rails in the first vertical metal layer M1 which run along the first direction y, from which power ports of the standard cells can be tapped further below, for example via the internal power pins 5, for example via internal power rails in the interconnect metal layer M0.

Figure 11:
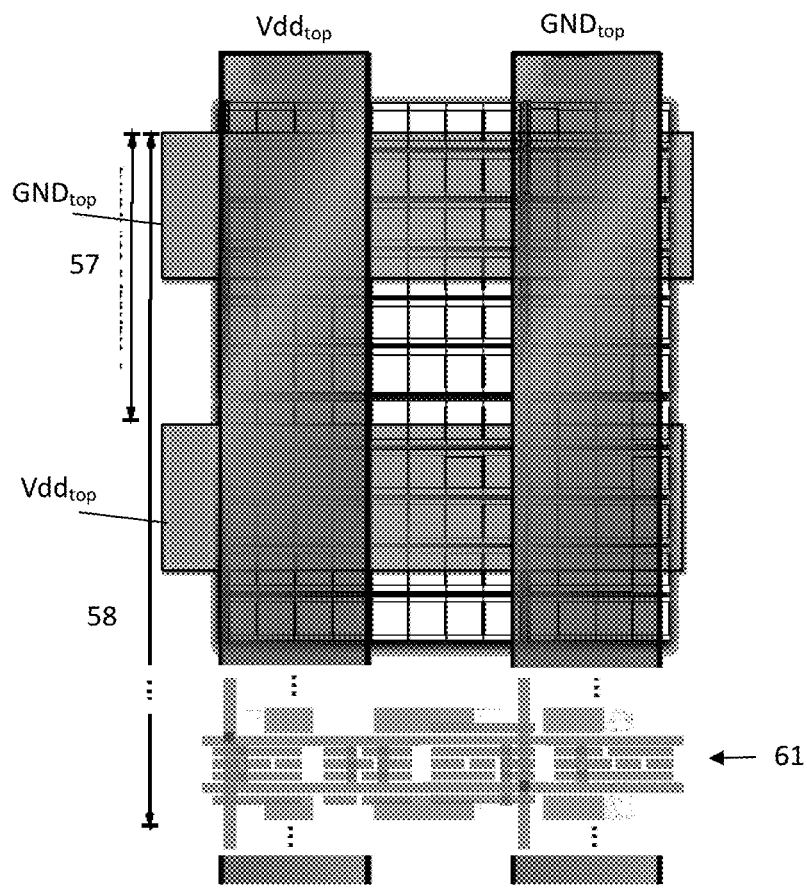
FIG. 11 shows internal power ports of the standard cells connecting directly to a vertical power rail, in a device in accordance with embodiments of the disclosed technology.

For example, a higher portion of the power distribution network can distribute the power and ground voltage supplied via the top metal layer 50 over power and ground power rail pairs at a predetermined pitch 58, which is typically larger, for example substantially larger, than the standard cell height and width. Further down, each power and ground pair can be distributed by a lower portion of the power distribution network that provides connections to the lowest level of power rails above the intra-cell level, for example to power rails in the first vertical metal layer M1, at a predetermined power to ground pitch 57, which can typically correspond to the width of about 8 standard cells. Thus, the lower metal resistive mesh can be sparse. In a device as known in the art, vertical power rails in the third metal layer M3 can cross and connect to horizontal power rails in the metal layer M2. Each row of standard cells can be powered in a prior-art device by a corresponding ground power rail and a corresponding supply voltage power rail in the metal layer M2. However, as shown in FIG. 11, in a device in accordance with embodiments of the disclosed technology, internal power ports of the standard cells in a row 61, for example power ports on an internal power rail 5, can connect directly to a vertical power rail in the metal layers, for example to a power rail provided in the first vertical metal layer M1.

Figure 13:
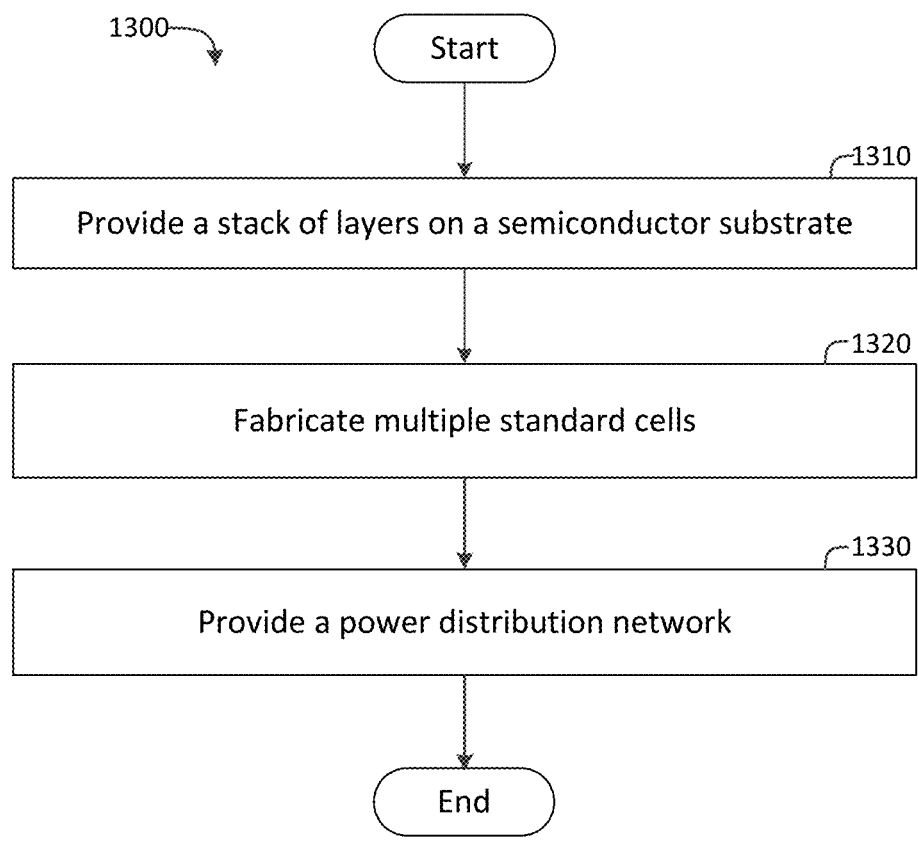
FIG. 13 is a flowchart illustrating a method of manufacturing a device in accordance with embodiments of the disclosed technology.

FIG. 13 is a flowchart illustrating a method 1300 of manufacturing an integrated circuit device in accordance with embodiments of the disclosed technology for example an integrated circuit device in accordance with embodiments of the first aspect of the disclosed technology.

In block 1310, method 1300 provides a stack of layers and a semiconductor substrate forming a bottom level of this stack. For example, method 1300 provides the semiconductor substrate and a plurality of layers thereon such as to form a stack.

In block 1320, method 1300 fabricates multiple standard cells, in which each standard cell includes a plurality of integrated transistors and interconnecting structures for locally interconnecting the transistors such as to provide a predetermined function of the standard cell. The standard cells are fabricated such that the standard cells include parallel gate structures oriented in a first direction parallel to the substrate. Each standard cell is manufactured such as to include at least one internal power pin for supplying a reference voltage to contacts of the integrated transistors in accordance with the predetermined function of the standard cell. This at least one internal power pin can be manufactured in a front-end-of-the-line process and/or a middle-of-line process.

Furthermore, providing the stack of layers includes providing a plurality of metal layers in which conductive metal lines are formed to route signals between the standard cells, for example to provide signal routing between the standard cells. The metal lines in each metal layer are providing to have a preferred orientation, in which each metal layer has a preferred orientation that is orthogonal to the preferred orientation of the metal lines in an adjacent metal layer of the plurality of metal layers.

A first vertical metal layer M1 of the plurality of metal layers is furthermore provided as the lowest metal layer in the stack that has the first direction as preferred orientation and that provides routing resources for signal routing between the standard cells. A second horizontal metal layer M2 of the plurality of metal layers is provided as the nearest metal layer above the first vertical metal layer M1 in the stack.

In block 1330, method 1300 provides a power distribution network for delivering the reference voltage, for example, a supply voltage and a ground voltage, to the at least one internal power pin, for example to an internal power rail, such that, for any conductive path in the power distribution network that electrically connects a further metal layer above the second horizontal metal layer M2 to the at least one internal power pin, any portion, of such conductive path, that is contained within the second horizontal metal layer M2 covers less than the width of the standard cell in a second direction orthogonal to the first direction. These and other features of a method in accordance with embodiments of the second aspect of the disclosed technology can be understood by the skilled person from the description provided hereinabove relating to embodiments of the first aspect of the disclosed technology.

In an embodiment, fabricating the standard cells can include providing an internal power rail extending in the second direction, in which this internal power rail is provided in a local interconnect metal layer M0 of the standard cells.

In an embodiment, fabricating the standard cells can include providing a buried power rail.

In an embodiment, providing the power distribution network can include providing at least one power rail, oriented along the first direction, in the first vertical metal layer M1.

In an embodiment, providing the power distribution network can include providing at least one power rail, oriented along the first direction, in a third metal layer M3 of the plurality of metal layers, wherein this third metal layer M3 is the nearest metal layer above the second horizontal metal layer M2 in the stack.

In an embodiment, providing the power distribution network can include providing at least one power staple in the second horizontal metal layer M2 for electrically connecting the power rail in the third vertical metal layer M3 to the power rail 7 in the first vertical metal layer M1.

In the above, the disclosed technology has mainly been described with reference to a limited number of embodiments. However, as is readily appreciated by a person skilled in the art, other embodiments than the ones disclosed above are equally possible within the scope of the invention, as defined by the appended claims.

Depending on the embodiment, certain acts, events, or functions of any of the methods described herein can be performed in a different sequence, can be added, merged, or left out altogether (for example, not all described acts or events are necessary for the practice of the method). Moreover, in certain embodiments, acts or events can be performed concurrently, rather than sequentially.

The previous description of the disclosed examples is provided to enable any person skilled in the art to make or use the disclosed technology. Various modifications to these examples will be readily apparent to those skilled in the art, and the generic principles defined herein can be applied to other examples without departing from the spirit or scope of the disclosed technology. As will be recognized, certain embodiments of the disclosed technology described herein can be embodied within a form that does not provide all of the features and benefits set forth herein, as some features can be used or practiced separately from others. The scope of certain inventions disclosed herein is indicated by the appended claims rather than by the foregoing description. All changes which come within the meaning and range of equivalency of the claims are to be embraced within their scope. Thus, the disclosed technology is not intended to be limited to the examples shown herein but is to be accorded the widest scope consistent with the principles and novel features disclosed herein.

What is claimed is:

1. An integrated circuit device comprising:
a semiconductor substrate;
a plurality of standard cells, each standard cell comprising:
a plurality of integrated transistors and interconnecting structures for locally interconnecting the transistors so as to provide a predetermined function of the standard cell, wherein each of the integrated transistors comprises at least one gate structure and wherein each gate structure is oriented in a first direction parallel to the substrate; and
at least one internal power pin for supplying a reference voltage to contacts of the integrated transistors in accordance with the predetermined function of the standard cell, wherein a spatial dimension of each standard cell measured in a second direction orthogonal to the first direction and parallel to the substrate defines a standard cell width;

a stack of layers comprising a plurality of metal layers in which conductive metal lines are formed to route signals between the standard cells, the metal lines in each metal layer having a preferred orientation, wherein each metal layer has a preferred orientation that is orthogonal to the preferred orientation of the metal lines in an adjacent metal layer of the plurality of metal layers, wherein a first vertical metal layer of the plurality of metal layers is the lowest metal layer in the stack that has the first direction as preferred orientation and that provides routing resources for signal routing between the standard cells, and wherein a second horizontal metal layer of the plurality of metal layers is the nearest metal layer above the first vertical metal layer in the stack, wherein the semiconductor substrate forms a bottom level of the stack; and a power distribution network for delivering the reference voltage to the at least one internal power pin, wherein for any conductive path in the power distribution network that electrically connects a further metal layer above the second horizontal metal layer to the at least one internal power pin, any portion of the conductive path that is contained within the second horizontal metal layer covers less than the width of the standard cell in the second direction, such that the power distribution network does not include any conductive path within the second horizontal metal layer spanning across more than any two adjacent standard cells in the second direction.

2. The integrated circuit device of claim 1, wherein the at least one internal power pin comprises a buried power rail.

3. The integrated circuit device of claim 1, wherein the at least one internal power pin comprises an internal power rail extending in the second direction, the internal power rail being provided in a local interconnect metal layer of the standard cells.

4. The integrated circuit device of claim 1, wherein the stack comprises at least one layer fabricated using multiple patterning, wherein the at least one layer is fabricated using self-aligned double patterning or self-aligned quadruple patterning.

5. The integrated circuit device of claim 1, wherein the power distribution network comprises at least one power rail oriented along the first direction and provided in the first vertical metal layer.

6. The integrated circuit device of claim 1, wherein the power distribution network comprises at least one power rail oriented along the first direction and provided in a third vertical metal layer of the plurality of metal layers, wherein the third vertical metal layer is the nearest metal layer above the second horizontal metal layer in the stack.

7. The integrated circuit device of claim 5, wherein the power distribution network comprises at least one power staple in the second horizontal metal layer for electrically connecting the power rail in the third vertical metal layer to the power rail in the first vertical metal layer.

8. The integrated circuit device of claim 1, wherein the power distribution network comprises at least one power strap oriented along the second direction and provided in a horizontal metal layer above the first vertical metal layer such as to locally connect two power rails oriented along the first direction, the two power rails being provided in the first vertical metal layer.

9. The integrated circuit device of claim 1, wherein the second horizontal metal layer has a larger pitch than the smallest pitch of the other metal layers in the stack.

10. A method for manufacturing an integrated circuit device, the method comprising:

providing a stack of layers on a semiconductor substrate;

fabricating a plurality of standard cells, each standard cell comprising a plurality of integrated transistors and interconnecting structures for locally interconnecting the transistors so as to provide a predetermined function of the standard cell, wherein each of the integrated transistors comprises at least one gate structure and wherein each gate structure is oriented in a first direction parallel to the substrate, the standard cell comprising at least one internal power pin for supplying a reference voltage to contacts of the integrated transistors in accordance with the predetermined function of the standard cell, wherein a spatial dimension of each standard cell measured in a second direction orthogonal to the first direction and parallel to the substrate defines a standard cell width, wherein providing the stack of layers comprises providing a plurality of metal layers in which conductive metal lines are formed to route signals between the standard cells, the metal lines in each metal layer having a preferred orientation, in which each metal layer has a preferred orientation that is orthogonal to the preferred orientation of the metal lines in an adjacent metal layer of the plurality of metal layers;

wherein a first vertical metal layer of the plurality of metal layers is provided as the lowest metal layer in the stack that has the first direction as a preferred orientation and that provides routing resources for signal routing between the standard cells, and wherein a second horizontal metal layer of the plurality of metal layers is provided as the nearest metal layer above the first vertical metal layer in the stack; and providing a power distribution network for delivering the reference voltage to the at least one internal power pin, such that, for any conductive path in the power distribution network that electrically connects a further metal layer above the second horizontal metal layer to the at least one internal power pin, any portion of the conductive path that is contained within the second horizontal metal layer covers less than the width of the standard cell in the second direction, such that the power distribution network does not include any conductive path within the second horizontal metal layer spanning across more than any two adjacent standard cells in the second direction.

11. The method of claim 10, wherein fabricating the plurality of standard cells comprises providing an internal power rail extending in the second direction, the internal power rail being provided in a local interconnect metal layer of the standard cells.

12. The method of claim 10, wherein providing the power distribution network comprises providing at least one power rail, oriented along the first direction, in the first vertical metal layer.

13. The method of claim 10, wherein providing the power distribution network comprises providing at least one power rail, oriented along the first direction, in a third vertical metal layer of the plurality of metal layers, wherein the third vertical metal layer is the nearest metal layer above the second horizontal metal layer in the stack.

14. The method of claim 13, wherein providing the power distribution network comprises providing at least one power staple in the second horizontal metal layer for electrically connecting the power rail in the third vertical metal layer to the power rail in the first vertical metal layer.

15. The integrated circuit device of claim 2, wherein the at least one internal power pin comprises an internal power rail extending in the second direction, the internal power rail being provided in a local interconnect metal layer of the standard cells.

16. The integrated circuit device of claim 15, wherein the power distribution network comprises at least one power strap oriented along the second direction and provided in a horizontal metal layer above the first vertical metal layer such as to locally connect two power rails oriented along the first direction, the two power rails being provided in the first vertical metal layer.

17. The integrated circuit device of claim 16, wherein the second horizontal metal layer has a larger pitch than the smallest pitch of the other metal layers in the stack.

18. The integrated circuit device of claim 17, wherein the power distribution network comprises at least one power rail oriented along the first direction and provided in the first vertical metal layer.

19. The integrated circuit device of claim 18, wherein the power distribution network comprises at least one power staple in the second horizontal metal layer for electrically connecting the power rail in the third vertical metal layer to the power rail in the first vertical metal layer.

\* \* \* \* \*